INVENTOR.
ALVA I. ARCHER
BY
Osmund R. Dahle
ATTORNEY

INVENTOR.
ALVA I. ARCHER
BY
Osmund R. Dahle
ATTORNEY

INVENTOR.
ALVA I. ARCHER
BY
Omund R. Dahle
ATTORNEY

INVENTOR.
ALVA I. ARCHER
BY Osmund R. Dahle
ATTORNEY 3,309,537
Patented Mar. 14, 1967

3,309,537
MULTIPLE STAGE SEMICONDUCTOR CIRCUITS AND INTEGRATED CIRCUIT STAGES

Alva I. Archer, North Palm Beach, Fla., assignor to Honeywell Inc., Minneapolis, Minn., a corporation of Delaware Filed Nov. 27, 1964, Ser. No. 427,199
22 Claims. (Cl. 307—88.5)

This application is a continuation-in-part of my copending application Serial No. 373,909, filed June 10, 1964, now abandoned entitled, "Semiconductor Apparatus," and assigned to the same assignee as the present application.

The present invention relates to semiconductor apparatus and more particularly to ring counters utilizing semiconductor devices.

Ring counters using active semiconductor devices are well known. Most prior art ring counters utilizing four layer devices have used capacitive coupling between devices or stages. The magnitude of capacitance required was a severe drawback when it was sought to integrate such counters into a single semiconductor chip. The ring counters of the present invention utilize four layer semiconductor devices and eliminate capacitive coupling between four layer devices. The present invention also provides circuits suitable for semiconductor integration. The present counters provide workable circuits with wide device tolerances. These circuits also provide counters having low power consumption.

The present invention provides ring counters having two four layer semiconductor devices per stage. Only one four layer device in the counter is in the conducting state at any one time. These four layer devices are turned on by a pulse to a control electrode and may be turned off by reducing the current through the device below a certain level called the holding current. The four layer device in the conducting state controls a transistor which triggers the succeeding four layer device during turn off of the previous device. Each input pulse to the counter causes a commutation of the conducting state to the second successive four layer device. Several forms of the ring counter of the present invention have been shown. Some are particularly useful in so-called negative logic applications, and the others are particularly useful in so-called positive logic applications. By negative logic, it is meant that the input signal to the counter remains at a relatively high level between input pulses, dropping to a lower level during the input pulse. By positive logic, it is meant that the input signal to the counter is at a relatively high level during the input pulse and drops to a lower level between input pulses.

The present invention may be more fully understood when taken in connection with the following specification and drawings wherein.

Figures 1, 2:
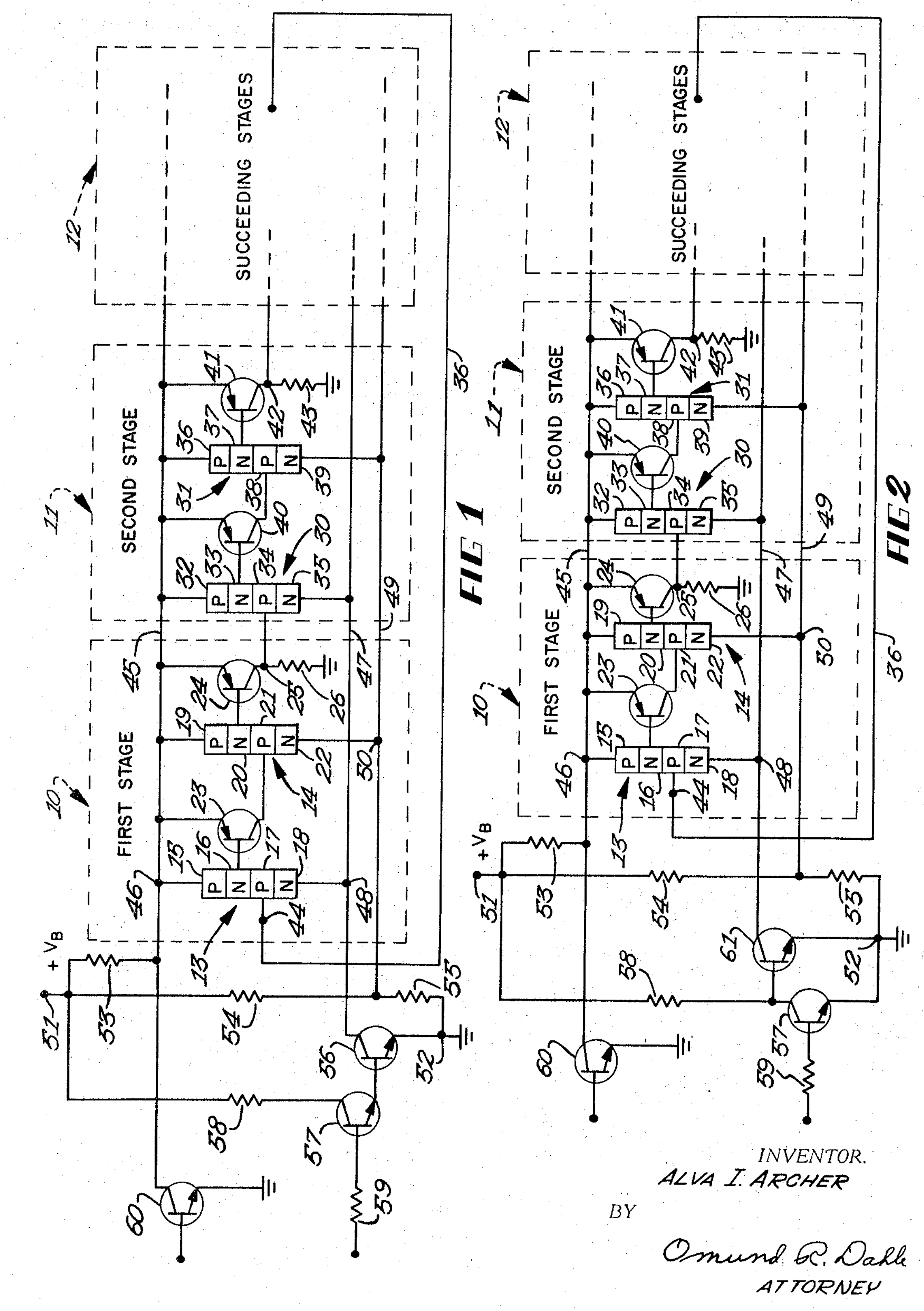
FIGURE 1 is a schematic circuit diagram of one ring counter utilizing the present invention.
FIGURE 2 is a schematic circuit diagram of another ring counter utilizing the present invention.

FIGURE 1 illustrates a ring counter, having a plurality of stages including a first stage 10, a second stage 11, and a number of succeeding stages shown as dotted box 12. Any desired number of succeeding stages may be used. Each stage is identical to stage 10. Each stage includes a plurality of current controlling means, shown in stage 10 as four layer semiconductor devices 13 and 14 and transistors 23 and 24.

Stage 10 includes two four layer devices generally designated 13 and 14. For example, these four layer devices may be silicon controlled rectifiers or silicon controlled switches. Device 13 has a first current carrying electrode, an output electrode, a control electrode, and a second current carrying electrode, shown as P layer 15, N layer 16, P layer 17, and N layer 18, respectively. Device 14 has a P layer 19, N layer 20, P layer 21 and N layer 22 as its first current carrying electrode, output electrode, control electrode, and second current carrying electrode, respectively. Layers 17 and 18 form a control circuit for device 13, and layers 15 and 16 form an output circuit. In device 14, layers 21 and 22 form a control circuit, and layers 19 and 20 form an output circuit. The output electrodes and circuits of these devices are rather unusual and should be particularly noted. A first PNP transistor 23 has its emitter or input electrode connected to layers 15 and 19, its base or control electrode connected to layer 16, and its collector or output electrode connected to layer 21. A second PNP transistor 24 has its emitter or input electrode connected to layer 19, its base or control electrode connected to layer 20, and its collector or output electrode connected to an output terminal 25. In each transistor, the emitter-base circuit forms a control circuit, and the emitter-collector circuit forms an output circuit. Load means, here shown as resistor 26, is connected between an output terminal 25 and a point of reference potential, here shown as ground.

Second stage 11 includes four layer devices 30 and 31. Device 30 has alternating P and N layers 32, 33, 34 and 35. Device 31 has alternating P and N layers 36, 37, 38 and 39. Second stage 11 also includes PNP transistors 40 and 41, an output terminal 42, and a load resistor 43. The internal interconnections between the elements of stage 11 are identical to those of stage 10. Output terminal 25 of stage 10 is connected to layer 34 of stage 11. Output terminal 42 of stage 11 is connected to the corresponding layer of the first device of a succeeding stage. The output terminal of each succeeding stage is connected in an identical manner. The output of the last stage is connected to a contact 44 on layer 17 by conductor 36.

A pair of energizing terminals 51 and 52 are provided for connection to a source of energy, not shown. Terminal 52 is connected to ground. Impedance means, here shown as a resistor 53, and a conductor 45, connect terminal 51 to each stage. Conductor 45 connects layer 32 and the corresponding layer of the first device of each succeeding stage to a contact 46 on layer 15. Resistor 53 is connected between terminal 51 and contact 46. Biasing means, here shown as resistors 54 and 55, and a conductor 49, connect each stage to terminals 51 and 52. Conductor 49 connects layer 39 and the corresponding layer on the second device of each succeeding stage to a contact 50 on layer 22. Resistors 54 and 55 connect contact 50 to terminals 51 and 52 respectively. Input circuit means, here shown as a conductor 47, an emitter follower transistor 56, an input transistor 57, a bias resistor 58, and an input resistor 59, connect each stage to terminal 52. Conductor 47 connects layer 35 and the corresponding layer of the first device of each succeeding stage to a contact 48 on layer 18. Emitter follower transistor 56 has its collector connected to contact 48, its emitter connected to terminal 52, and its base connected to the emitter of input transistor 57. Resistor 58 is connected between the collector of transistor 57 and terminal 51. Input resistor 59 is connected to the base of transistor 57. A clear transistor 60 has its collector connected to terminal 46 and its emitter connected to ground.

FIGURE 2 discloses a ring counter circuit identical to that of FIGURE 1 except for the input circuit means connecting each stage to terminal 52. FIGURE 2 shows an inverter transistor 61 with its collector connected to contact 48 and its emitter connected to terminal 52. The base of transistor 61 is connected to the collector of transistor 57. The emitter of transistor 57 is connected to terminal 52. The differing input circuitry causes the ring counters of FIGURES 1 and 2 to operate in a slightly different manner as will be later described.

Figure 6:
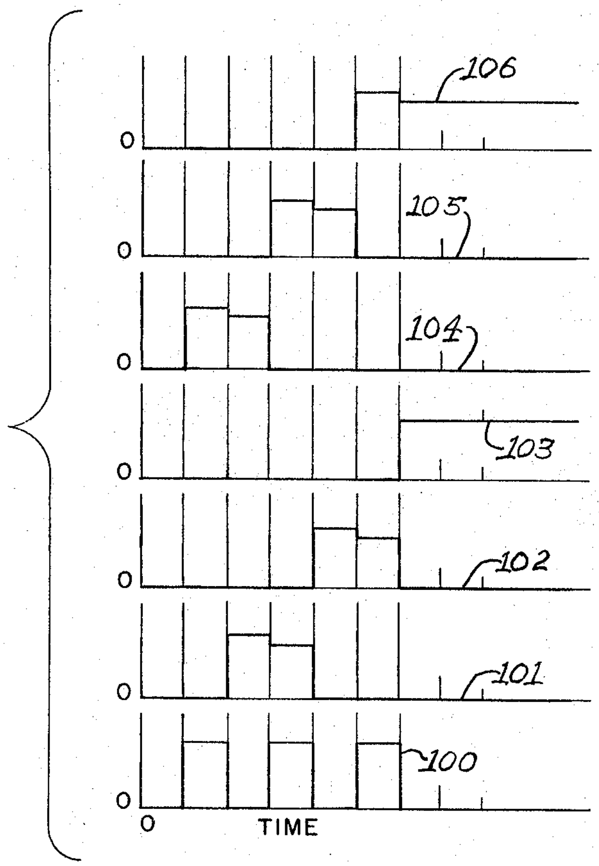
FIGURE 6 is a graphical representation of input and output pulse amplitudes as a function of time for various forms of the invention.

In describing the operation of FIGURES 1 and 2, reference will be had to FIGURE 6 which illustrates signal amplitudes at various points of the circuits as a function of time. The horizontal time scale is the same for all of the curves of FIGURE 6. Each of the curves is at zero amplitude at time zero. The curves are displaced vertically in FIGURE 6 for the sake of clarity. Curve 100 represents an input signal applied to input resistor 59 of FIGURES 1 or 2. Curve 101 represents the output signal of stage 10 of FIGURE 1, curve 102 represents the output signal of stage 11 of FIGURE 1, and curve 103 represents the output signal of a third stage of FIGURE 1. Curves 104, 105, and 106 represent the output signals of first, second, and third stages respectively of FIGURE 2. From curves 101–103, it may be seen that the circuit of FIGURE 1 provides negative logic wherein the output signal is commutated to the next stage by negative going input pulses. From curves 104–106, it may be seen that the circuit of FIGURE 2 provides positive logic wherein the output signal is commutated to the next state by positive going input pulses.

To operate the circuit of FIGURE 1, terminals 51 and 52 must be connected across the terminals of a source of energy. The counter of FIGURE 1 is not self-starting. To set the counter for operation, simultaneous positive pulses are applied to input resistor 59 and the output terminal of the stage immediately proceeding the stage in which the set count is desired. Upon termination of the pulse to input resistor 59, an output signal appears at the output of the desired stage. Each succeeding input signal causes the output signal to commutate to the output terminal of the next successive stage.

In explaining the commutation of the output signal, assume that an output signal appears at the output terminal 25 of stage 10. Four layer device 14 is in a conducting state and biases transistor 24 for on operation. Current flows from terminal 51 through resistor 53, device 14, and resistor 55 to ground, and through resistor 53, transistor 24 and resistor 26 to ground. During a positive input pulse applied to input resistor 59, input transistor 57 and emitter follower transistor 56 are both turned on, essentially grounding contact 48. In order to turn on the first device of any stage, there must be a sufficient positive potential felt at layer 17, layer 34, or the corresponding layer of first device of one of the successive stages. The only layer experiencing such a potential is P layer 34 which is biased by the voltage drop across resistor 26. This forward bias across the junction between layers 34 and 35 will cause device 30 to fire. The potential at conductor 45 and layer 38 then becomes close to ground. The potential at contact 50, due to resistors 54 and 55, causes the current through device 14 to drop. As the current through device 14 falls to less than the holding current, device 14 turns off causing transistor 24 to turn off. At this time, the output signal at terminal 25 is approximately the forward bias potential appearing between layers 34 and 35. With device 30 on, transistor 40 is biased for on operation. Biasing resistors 54 and 55 are chosen to provide a potential at contact 50 which prevents device 31 from turning on during the input pulse. As the input pulse ends, device 30 begins to turn off and the potential at conductor 45 rapidly rises to a value well above ground. The potential at layer 39 is not effected by the input pulse or the turn off of device 30. During turn off of device 30, transistor 40 is also turning off. However, the rising potential along conductor 45 causes a rise in the potential at layer 38 before complete turn off of transistor 40. Application of this momentary higher potential at layer 38 causes device 31 to fire. Once device 31 is turned on, it remains on until either the current path is broken or the current through device 31 is reduced to a level less than the holding current. As device 31 turns on, it creates a forward bias on the base-emitter junction of transistor 41 causing transistor 41 to turn on. Turn on of transistor 41 raises the potential at output terminal 42 to register an output signal.

Successive pulses to input resistor 59 cause commutation of the output signal to the output terminal of successive stages. Since the stages are connected in a ring, the output signal commutates around the ring until the counter is cleared. The counter is cleared by applying a positive pulse to the base of clear transistor 60. Such a pulse turns on transistor 60 essentially grounding conductor 45 and shunting the current through resistor 53 to ground through transistor 60 turning off any four layer device which had been on.

The operation of FIGURE 2 is similar to that of FIGURE 1 with a few differences that will be pointed out. Turn on of the four layer devices occurs in the same manner as described above. In the case of FIGURE 2, however, contact 48 is essentially grounded between positive input pulses. This is due to inverter transistor 61 which is biased for on operation until an input signal pulse is applied to input resistor 59. An input pulse turns on input transistor 57, essentially grounding its collector and the base of transistor 61, thus turning off transistor 61. The first four layer device of any stage may be fired without an accompanying input signal by applying a positive pulse to the output terminal of the preceding stage. For example, device 30 would be fired by applying a positive pulse to terminal 25 while transistor 61 is on. Until the first input pulse appears, the output signal observable at terminal 25 will be approximately the forward bias potential exhibited by the junction between layers 34 and 35. As an input pulse is applied to input resistor 59, device 30 turns off, device 31 is turned on, and an output signal appears at output terminal 42. With termination of the input pulse, the first four layer device of the stage succeeding stage 11 will fire, and the output signal at terminal 42 appears as approximately the forward bias potential. The relation of the input signals to the output signals from the circuits of FIGURES 1 and 2 may readily be seen by inspection of the curves in FIGURE 6. The relative amplitudes of the two portions of the output signal curve may be adjusted by adjustment of the magnitude of the output resistors.

Figures 3, 4:
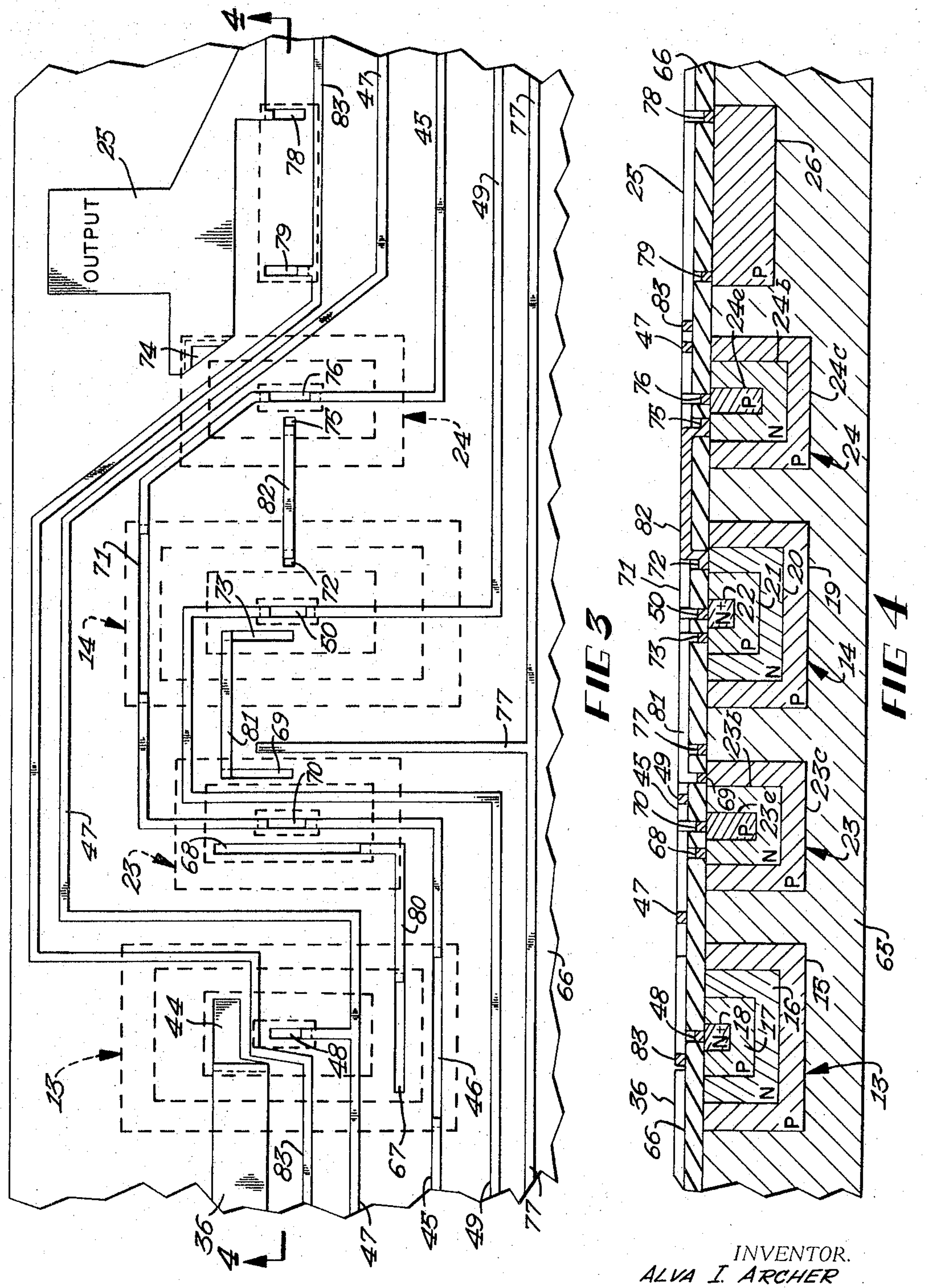
FIGURE 3 is a diagrammatic plan view of a portion of a semiconductor chip illustrating an integrated stage of a ring counter utilizing the present invention.
FIGURE 4 is a cross sectional view of FIGURE 3 taken along line IV—IV.

FIGURES 3 and 4 are top and cross sectional views of a portion of a silicon chip showing, diagrammatically, one embodiment of a single stage of the ring counter of FIGURES 1 or 2. The depth dimensions are greatly exaggerated for clarity. The stage is formed in an N type silicon substrate 65 which is heated and oxidized to grow an oxide coating 66. In the drawings, both the original and later regrown oxide layers are shown by the numeral 66 for the sake of clarity. Masking and etching techniques are then used to remove portions of the oxide layer for successive diffusion, contact, and lead evaporation steps. Such techniques will be readily apparent to those skilled in the art. The etched chip is then subjected to a first diffusion of the P type impurity to form regions or layers 12, 23*c*, 19 and 24*c*. Boron or other known diffusants may be used to provide the P type dopant. Either constant source or limited source methods of diffusion may be used. The wafers may be reoxided either during or subsequent to the P diffusion. They are then remasked and etched for an N type diffusion. The second diffusion forms N regions or layers 16, 23*b*, 20 and 24*b*. This diffusion may be carried out using phosphorous, antimony or any other suitable N type source material. After repeating the same preparation procedure, a third diffusion of P type material forms regions or layers 17, 23*e*, 21, 24*e* and 26. A fourth diffusion provides regions or layers 18 and 22 of heavily doped N type material. Regions 15–18 form device 13; regions 19–22 form device 14; regions 23*e*, *b*, *c* form transistor 23; regions 24*e*, *b*, *c* form transistor 24; and region 26 forms resistor 26.

The following procedure is an example of one successful chip preparation. An N type silicon chip having a resistivity of 10 ohm centimeters and a thickness of 8 mils was heated in a wet, oxidizing atmosphere to grow an oxide coating. The first P type diffusion used $BBr_3$ as a source material. The diffusion was carried out to obtain a junction depth of 0.64 mil and a sheet resistivity of the diffused regions 770 ohms per square. The second diffusion utilized $Sb_2O_3$ as a source. It was carried out to obtain a junction depth of 0.36 mil and a sheet resistivity of 190 ohms per square. The third diffusion utilized $BBr_3$ as a source. The resistive regions had a junction depth of 0.26 mil and a sheet resistivity of 145 ohms per square while the device regions had a junction depth of 0.17 mil and a sheet resistivity of 190 ohms per square. The fourth and final diffusion was carried out using $PCl_3$ as a source. The junction depth obtained was 0.13 mil and the sheet resistivity was about 2.02 ohms per square.

After the final diffusion, ohmic contacts are made to the chip. These contacts are shown in FIGURE 3, and are all made by the normal method of cutting holes through the oxide, then subsequently depositing the contact material over the surface of the oxide and the exposed silicon. Only a few of the contacts are shown in FIGURE 4 for clarity. The contacts, as shown on FIGURE 3, are: contact 46 to region 15, contact 67 to region 16, contact 44 to region 17, contact 48 to region 18, contact 68 to region 23*c*, contact 69 to region 23*b*, contact 70 to region 23*e*, contact 71 to region 19, contact 72 to region 20, contact 73 to region 21, contact 50 to region 22, contact 74 to region 24*c*, contact 75 to region 24*b*, contact 76 to region 24*e*, contact 77 to substrate 65, contact 78 to one end of region 26, and contact 79 to the other end of region 26. Aluminum, or other suitable materials may be used to make the contacts. Finally, the conductive material is masked and etched, leaving the following conductive paths: conductor 45 connecting contacts 46, 70, 71, and 76; conductor 80 connecting contacts 67 and 68; conductor 36 from the output of the previous stage, not shown, connecting to contact 44; conductor 47 connecting to contact 48 and leading to the next stage, not shown; conductor 81 connecting contacts 69 and 73; conductor 49 connecting to contact 50 and leading to the next stage; conductor 82 connecting contacts 72 and 75; conductor 83 forming the ground line and connecting to contact 79; and conductor 25, forming the output terminal, connecting contacts 74 and 78, and leading to the next stage. In the embodiment of FIGURES 3 and 4, substrate contact 77 is for connection to the positive terminal of an energy source to isolate devices from one another within the substrate. Ground line 83 grounds one end of resistor 26.

Figure 5:
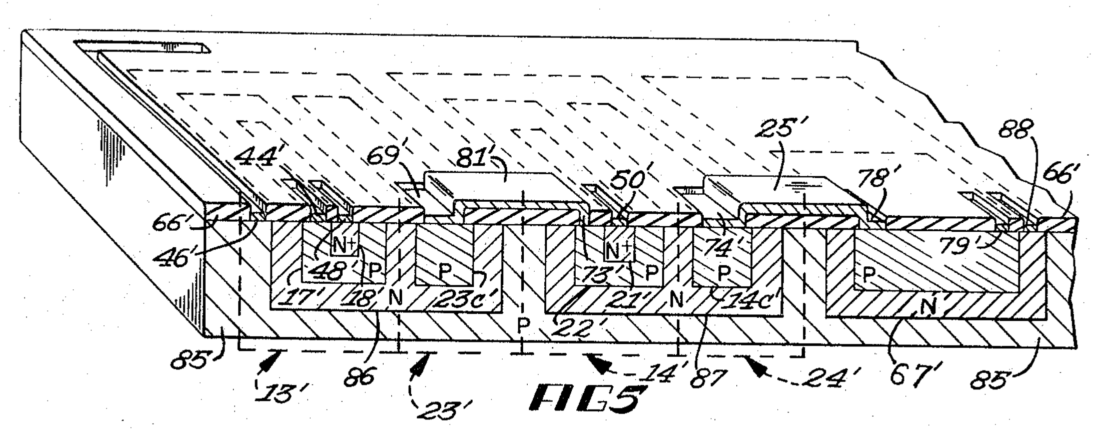
FIGURE 5 is a diagrammatic cross sectional perspective view of a portion of a semiconductor chip showing a modified form of an integrated stage of the ring counter.

FIGURE 5 shows a partial cross sectional diagrammatic view of a further embodiment of an integrated single stage for use in the circuits of FIGURES 1 and 2. Again the vertical dimensions are exaggerated relative to the horizontal ones. The diffusion, contact, and leading steps are carried out in the same manner as those previously described. The embodiment of FIGURE 5 requires only three diffusions instead of the four indicated in the description of FIGURES 3 and 4. In FIGURE 5, a P type substrate 85 forms a common region analogous to P regions 15, 23*e*, 19, 24*e*, and conductor 45 as shown in FIGURES 3 and 4. The first N type diffusion forms regions 86, 87, and 67′. Region 86 is analogous to regions 16, 23*b*, and conductor 80 as shown in FIGURES 3 and 4. Region 87 is analogous to regions 20, 24*b* and conductor 82 as shown in FIGURES 3 and 4. Referring again to FIGURE 5, an ohmic contact 88 on region 67′ is for connection to the positive terminal of a source of energy to reverse bias the junctions between region 67′ and 26, and between region 67′ and 85, thereby isolating 26′ so it may be used as a diffused resistor. Ohmic contact 79′ is for connection to ground. Numbers indicated by a prime (′) in FIGURE 5 correspond to similar regions in the embodiment of FIGURES 3 and 4 and like parts of the circuit of FIGURE 1.

The embodiment in FIGURE 5 has distinct advantages in that it requires only three diffusions and a minimum number of external leads and contacts. The embodiment of FIGURES 3 and 4 has the advantage that parasitic interactions between elements are eliminated. This latter advantage is particularly important when the input circuitry is integrated into the same semiconductor chip as the ring stages.

Figure 7:
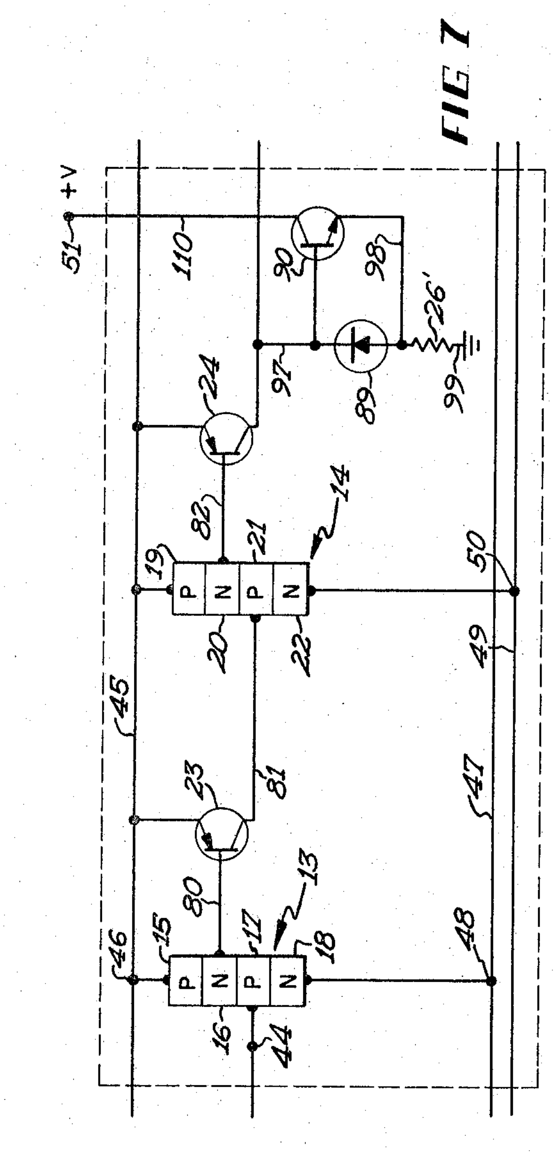
FIGURE 7 is a schematic circuit diagram of a modified counter stage for use in the circuits of FIGURES 1 and 2.

FIGURE 7 discloses a modified counter stage. Stages such as the one shown in FIGURE 7 may be substituted for each of the stages in the circuits of FIGURES 1 and 2. The modified stage utilizes a transistor-diode combination to reduce the minimum load resistance required in each stage to 1 kilohm or less. The major portion of the modified stage is identical to that of FIGURE 1 and is identified by the same numerals. The modification includes a diode 89 connected between output terminal 25 and the collector of transistor 24. A conductor 97 connects a first contact on diode 89 to the collector of transistor 24. Load resistor 26′ has one end connected to output terminal 25 and the other end connected to ground through a conductor 99. Diode 89 is connected in the blocking direction for current through load resistor 26′, diode 89, and transistor 24. A transistor 90 has a control electrode, here shown as a base electrode, connected to the collector of transistor 24, a first current carrying electrode, here shown as an emitter electrode, connected to output terminal 25 through a conductor 98, and a second current carrying electrode, here shown as a collector electrode, connected to terminal 51 through a conductor 110.

In operation, a counter utilizing stages like that shown in FIGURE 7 operates in a manner similar to those shown in FIGURES 1 and 2. Commutation of a pulse through the stage is in two steps as above described. When transistor 24 conducts, base current is supplied to transistor 90 and it likewise conducts. Current then flows through resistor 26′ and an output voltage appears at terminal 25. The current gain contributed by transistor 90 allows the voltage at terminal 25 to be maintained at a sufficiently high value with a smaller resistor 26'. Diode 89 permits the counter to be set from the cleared position by application of a pulse to an output terminal. A voltage applied at terminal 25 is transmitted through diode 89 to the third layer of the first four layer device in the succeeding stage just as occurs in the operation of the circuits of FIGURES 1 and 2.

Figure 8:
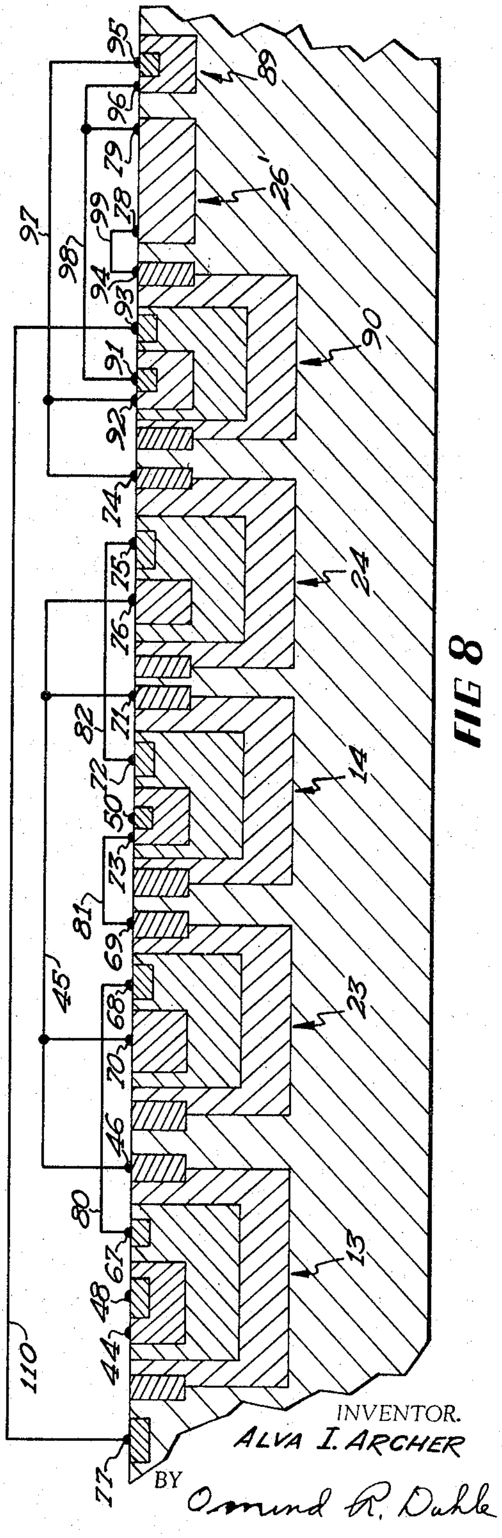
FIGURE 8 is a diagrammatic cross sectional view of a semiconductor integrated version of the stage of FIGURE 7.

FIGURE 8 is a diagrammatic cross sectional view of a portion of a semiconductor chip showing one method of integrating the stage shown in FIGURE 7. The vertical dimensions in FIGURE 8 have been exaggerated greatly to improve the clarity. The conductive interconnections have also been shown schematically to reduce the complexity of FIGURE 8. A wafer such as that shown may be obtained by performing four diffusions into a semiconductor substrate. The four diffusions are readily identifiable in the figure by their differing cross hatching direction and spacing.

In one particular example, the starting wafer was N type silicon having a 10 ohm-centimeter resistivity. The first diffusion was a P type diffusion which resulted in a surface concentration of $1\text{–}3\times10^{16}$ impurity atoms per cubic centimeter. The second diffusion was an N type diffusion which resulted in a surface concentration of $1\text{–}3\times10^{17}$ impurity atoms per cubic centimeter. The third diffusion was a P+ diffusion which resulted in a surface concentration of about $3\times10^{18}$ impurity atoms per cubic centimeter. Finally, the fourth diffusion was an N+ diffusion which resulted in a surface concentration in excess of $10^{20}$ impurity atoms per cubic centimeter. During the P+ diffusion, a P+ ring was diffused about the surface perimeter of each of the previously diffused P type regions. This P+ ring formed the area to which the ohmic contacts were applied and prevented shorting of the P–N junction due to surface effects. During the N+ diffusion, small areas of each of the N type regions were exposed to provide small N+ regions for good ohmic contact. Ohmic contacts were then applied to each of the regions of the active and passive circuit elements. Regions and ohmic contacts corresponding with those shown in FIGURE 3 and FIGURE 7 have the same identification numerals. In addition, ohmic contacts 91, 92, and 93 were made to the emitter, base, and collector of transistor 90 respectively. Ohmic contact 94 was made to the isolation region surrounding transistor 90. Ohmic contacts 95 and 96 were made to the cathode and anode of diode 89 respectively. In the portion shown schematically, conductor 97 connects ohmic contacts 74, 92, and 95; conductor 98 connects ohmic contacts 91, 79, and 96; conductor 99 connects ohmic contacts 94 and 78; and conductor 110 connects ohmic contacts 77 and 93. Conductor 110 is for connection to the positive terminal of a voltage supply, and conductor 99 is for connection to the negative terminal of the voltage supply. An extension of conductor 98 forms output terminal 25.

Many modifications of the present invention will be readily apparent to those skilled in the art. Although the four layer devices have been shown as PNPN structures, and the triggering transistors as PNP transistors, the invention can readily be adapted to use NPNP four layer devices in combination with NPN triggering. Many adaptations of input circuit means, the clearing circuit, impedance means, and biasing means will be readily apparent to those skilled in the art. For example, the same result as achieved by the circuit of FIGURE 1 is obtained by connecting input resistor 59 directly to the base of transistor 56 and omitting transistor 57 and biasing resistor 58. Such changes, of course, reduce the gain of the input signal. Also, the apparatus need not be used as a ring counter but may be a delay device or similar mechanism. In this case, the last stage output need not be fed back to the first stage.

It should therefore be understood that the present invention is not limited to the embodiments described, but is limited only by the scope of the appended claims.

I claim:

1. A ring counter comprising:
a plurality of electrically energizable stages,
each of said stages including
first and second four layer semiconductor devices,
first semiconductor current controlling means connected in controlling relation to said second device,
means connecting said first device in controlling relation to said first semiconductor means,
further semiconductor current controlling means for connection in controlling relation to the first device of another stage, and
means connecting said second device in controlling relation to said further semiconductor means;
means electrically interconnecting said plurality of stages in a ring;
first and second energizing terminals for connection to a source of energy;
means electrically connecting all of said first devices between said first and second terminals; and
means electrically connecting all of said second devices between said first and said second terminals.

2. A ring counter comprising:
a plurality of electrically energizable stages,
each of said stages including
first and second four layer semiconductor devices,
first semiconductor current controlling means connected in controlling relation to said second device,
means connecting said first device in controlling relation to said first semiconductor means,
further semiconductor current controlling means for connection in controlling relation to the first device of another stage, and
means connecting said second device in controlling relation to said further semiconductor means;
means electrically interconnecting said plurality of stages in a ring;
first and second energizing terminals for connection to a source of energy;
impedance means connecting all of said first and second semiconductor devices to said second terminal;
input circuit means connecting all of said first devices to said first terminal; and
biasing means connecting all of said second devices to one of said terminals.

3. A ring counter having four layer semiconductor devices controlled by semiconductor current controlling means, said counter comprising:
a plurality of electrically energizable stages,
each of said stages including
a first four layer semiconductor device having a first control circuit and a first output circuit,
a second four layer semiconductor device having a second control circuit and a second output circuit,
semiconductor current controlling means having control circuit means connected across said first output circuit, and having output circuit means connected to said second control circuit, and
further semiconductor current controlling means having further control circuit means connected across said second output circuit, and having further output circuit means for connection to the first control circuit of another stage;

means electrically interconnecting said plurality of stages in a ring;

first and second energizing terminals for connection to a source of energy;

means electrically connecting all of said first devices between said first and second terminals; and means electrically connecting all of said second devices between said first and second terminals.

4. A ring counter comprising:

a plurality of electrically energizable stages, each of said stages including a first four layer semiconductor device having a plurality of electrodes including first and second current carrying electrodes, a first output electrode, and a first control electrode, a second four layer semiconductor device having a plurality of electrodes including a third current carrying electrode conductively connected to said first current carrying electrode, a fourth current carrying electrode, a second output electrode, and a second control electrode, first semiconductor current controlling means having a plurality of electrodes including a first means control electrode conductively connected to said first output electrode, a first means output electrode conductively connected to said second control electrode, and a first means input electrode conductively connected to said first current carrying electrode, and further semiconductor current controlling means, having a plurality of electrodes including a further means control electrode conductively connected to said second output electrode, a further means output electrode for conductive connection to the first control electrode of another stage, and a further means input electrode conductively connected to said first current carrying electrodes;

means electrically interconnecting said plurality of stages in a ring;

first and second energizing terminals for connection to a source of energy;

means electrically connecting all of said first current carrying electrodes to said first terminal;

means electrically connecting all of said second current carrying electrodes to said second terminal; and means electrically connecting all of said fourth current carrying electrodes to one of said terminals.

5. A ring counter having four layer semiconductor devices controlled by transistors, said counter comprising:

a plurality of electrically energizable stages, each of said stages including a first four layer semiconductor device having a plurality of electrodes including first and second current carrying electrodes, a first output electrode, and a first control electrode, a second four layer semiconductor device having a plurality of electrodes including a third current carrying electrode conductively connected to said first current carrying electrode, a fourth current carrying electrode, a second output electrode, and a second control electrode, a first transistor having a first emitter conductively connected to said first current carrying electrode, a first base conductively connected to said first output electrode, and a first collector conductively connected to said second control electrode, and a second transistor having a second emitter conductively connected to a said third current carrying electrode, a second base conductively connected to said second output electrode, and a second output electrode, and a second collector for conductive connection to the first control electrode of another stage;

means directly connecting each of said second collectors to the first control electrode of another stage to form a ring of stages;

first and second energizing terminals for connection to a source of energy;

impedance means connecting all of said first current carrying electrodes to said first terminal;

input circuit means connecting all of said second current carrying electrodes to said second terminal; and biasing means connecting all of said fourth current carrying electrodes to one of said terminals.

6. A ring counter as defined in claim 5 wherein each stage also includes:

a load having first and second contacts, said first contact conductively connected to said second terminal;

a diode connected between said second collector and said second load contact in the blocking direction for collector current in said second transistor; and a third transistor having a first current carrying electrode conductively connected to said second load contact, a second current carrying electrode conductively connected to said first terminal and a control electrode conductively connected to said second collector.

7. A ring counter having four layer semicoductor devices controlled by semiconductor current controlling means, said counter comprising:

a plurality of electrically energizable stages, each of said stages including a first semiconductor device having first and third layers of one conductivity type alternating with second and fourth layers of opposite conductivity type, a second semiconductor device having fifth and seventh layers of said one conductivity type alternating with sixth and eighth layers of said opposite conductivity type, said fifth layer being conductively connected to said first layer, semiconductor current controlling means having control circuit means connected to said first and second layers, and having output circuit means connected to said first and seventh layers, and further semiconductor current controlling means having further control circuit means connected to said fifth and sixth layers, and having further output circuit means connected to said fifth layer and an output terminal;

means electrically connecting each said output terminal to the third layer of another stage to form a ring of stages;

first and second energizing terminals for connection to a source of energy, said first terminal defining a a point of reference potential;

means electrically connecting all of said first devices to said first and second terminals; and, means electrically connecting all of said second devices to said first and second terminals.

8. A ring counter as defined in claim 7 wherein each stage also includes load means connected between said output terminal and said point of reference potential.

9. A ring counter having four layer semiconductor devices controlled by transistors, said counter comprising:
a plurality of electrically energizable stages,
each of said stages including
a first semiconductor device having first and third layers of one conductivity type alternating with second and fourth layers of an opposite conductivity type,
a second semiconductor device having fifth and seventh layers of said one conductivity type alternating with sixth and eighth layers of said opposite conductivity type,
a first transistor having a first emitter of said one conductivity type connected to said first and fifth layers, having a first base of said opposite conductivity type connected to said second layer, and having a first collector of said one conductivity type connected to said seventh layer,
a second transistor having a second emitter of said one conductivity type connected to said fifth layer, having a second base of said opposite conductivity type connected to said sixth layer, and having a second collector of said one conductivity type for connection to the third layer of another stage, and
load means connecting said second collector to a point of reference potential;
means directly connecting each of said second collectors to the third layer of another stage to form a ring of stages;
first and second energizing terminals for connection to a source of energy, said first terminal being connected to said point of reference potential;
impedance means connecting all of said first layers to said second terminal;
biasing means connecting all of said eighth layers to one of said terminals; and
input circuit means connecting all of said fourth layers to said first terminal.

10. An integrated semiconductor ring counter stage comprising:
a block of semiconductive material having a first conductivity type;
first, second, third, and fourth regions of opposite conductivity type disposed within said block;
fifth, sixth, seventh, and eighth regions of said first conductivity type disposed respectively within said first through fourth regions;
ninth, tenth, eleventh, twelfth, and thirteenth regions of said opposite conductivity type disposed within said fifth through eighth regions and said block respectively;
fourteenth and fifteenth regions of said first conductivity type disposed respectively within said ninth and eleventh regions;
first and second ohmic contacts at opposite ends of said thirteenth region;
ohmic contacts to each of said first, second, third, fourth, fifth, sixth, seventh, eighth, ninth, tenth, eleventh, twelfth, fourteenth, and fifteenth regions and to said semiconductive block;
conductive means connecting said fourth region contact to said first contact;
conductive means connecting said fifth region contact to said sixth region contact;
conductive means connecting said seventh region contact to said eighth region contact;
conductive means connecting said second region contact to said eleventh region contact; and
conductive means connecting said first region contact, said tenth region contact, said third region contact and said twelfth region contact.

11. A ring counter stage as defined in claim 10 wherein said first conductivity type is N type and said opposite conductivity type is P type.

12. An integrated semiconductor ring counter stage comprising:
a block of semiconductive material having a first conductivity type;
first and second regions of opposite conductivity type disposed within said block;
third and fourth regions of said first conductivity type disposed within said first region;
fifth and sixth regions of said first conductivity type disposed within said second region;
seventh and eighth regions of said opposite conductivity type disposed respectively within said third and fifth regions;
ohmic contacts to each of said third, fourth, fifth, sixth, seventh and eighth regions and to said semiconductive block; and
conductive means connecting said fourth region contact to said fifth region contact.

13. An integrated semiconductor ring counter stage comprising:
a block of semiconductive material having a first conductivity type;
first, second, and third regions of opposite conductivity type disposed within said block;
fourth and fifth regions of said first conductivity type disposed within said first region;
sixth and seventh regions of said opposite conductivity type disposed within said second region;
an eighth region of said first conductivity type disposed within said third region;
ninth and tenth regions of said opposite conductivity type disposed respectively within said fourth and sixth regions;
first and second ohmic contacts at opposite ends of said eighth region;
ohmic contacts to each of said first, second, third, fourth, fifth, sixth, seventh, ninth, and tenth regions and to said semiconductive block;
conductive means connecting said fifth region contact to said sixth region contact; and
conductive means connecting said seventh region to said first contact.

14. A ring counter stage as defined in claim 13 wherein said first conductivity type is P type and said opposite conductivity type is N type.

15. A semiconductor apparatus comprising:
a plurality of electrically energizable stages,
each of said stages including
first and second four layer semiconductor devices,
first semiconductor current controlling means connected in controlling relation to said second device,
means connecting first device in controlling relation to said first semiconductor means,
further semiconductor current controlling means for connecting in controlling relation to the first device of another stage, and
means connecting said second device in controlling relation to said further semiconductor means;
means electrically interconnecting said plurality of stages;
first and second energizing terminals for connection to a source of energy;
means electrically connecting all of said first devices between said first and second terminals; and
means electrically connecting all of said second devices between said first and second terminals.

16. An integrated semiconductor ring counter stage comprising:

a block of semiconductive material having a first conductivity type;

first, second, third, and fourth regions of opposite conductivity type disposed within said block;

fifth, sixth, seventh, and eigth regions of said first conductivity type disposed respectively within said first through fourth regions;

ninth, tenth, eleventh, and twelfth regions of said opposite conductivity type disposed respectively within said fifth through eighth regions;

thirteenth and fourteenth regions of said first conductivity type disposed respectively within said ninth and eleventh regions;

ohmic contacts to each of said regions and to said semiconductive block;

conductive means connecting said fifth region contact to said sixth region contact;

conductive means connecting said seventh region contact to said eighth region contact;

conductive means connecting said second region contact to said eleventh region contact; and further conductive means connecting said first region contact, said tenth region contact, said third region contact and said twelfth region contact.

17. A ring counter stage as defined in claim 16 which further includes:

an isolation region of said opposite conductivity type disposed within said block, said isolation region having an ohmic contact thereon and having disposed therein a transistor with first and second current carrying contacts and a control contact;

a diode disposed within said block, said diode having first and second contacts;

a resistor disposed within said block, said resistor having a pair of ohmic contacts at opposite ends thereof;

conductive means connecting said fourth layer, said control contact and said first diode contact;

conductive means connecting said first current carrying contact, said second diode contact and one of said resistor contacts so that said diode is connected in the blocking direction for current flow through said resistor, diode, and fourth layer;

conductive means connecting the other of said resistor contacts to said isolation region; and conductive means connecting said second current carrying contact to said block contact.

18. A semiconductor apparatus comprising:

a plurality of stages in accordance with claim 16 wherein, in each stage said first, fifth, ninth, and thirteenth regions form a first four layer semiconductor device, said third, seventh, eleventh, and fourteenth regions form a second four layer semiconductor device, said second, sixth, and tenth regions form first semiconductor current controlling means, and said fourth, eighth, and twelfth regions form further semiconductor current controlling means for connecting in controlling relation to the first device of another stage, and wherein each stage further includes means, including said conductive means connecting said fifth and sixth region contacts, connecting said first device in controlling relation to said first semiconductor means, further means, including said conductive means connecting said second and eleventh region contacts, connecting said first semiconductor means in controlling relation to said second device, and additional means, including said conductive means connecting said seventh and eighth region contacts, connecting said second device in controlling relation to said further semiconductor means;

means electrically interconnecting said plurality of stages;

first and second energizing terminals for connection to a source of energy;

means electrically connecting all of said further conductive means and said thirteenth region contacts between said first and second terminals thereby connecting all of said first devices therebetween; and means electrically connecting all of said further conductive means and said fourteenth region contacts between said first and second terminals thereby connecting all of said second devices therebetween.

19. A semionductor apparatus comprising:

a plurality of stages in accordance with claim 16;

means electrically interconnecting said plurality of stages;

first and second energizing terminals for connection to a source of energy;

means electrically connecting all of said further conductive means and said thirteenth region contacts between said first and second second terminals; and means electrically connecting all of said further conductive means and said fourteenth region contacts between said first and second terminals.

20. A semiconductor apparatus in accordance with claim 19 wherein each stage further includes:

an isolation region of said opposite conductivity type disposed within said block, said isolation region having an ohmic contact thereon and having disposed therein a transistor with first and second current carrying contacts and a control contact;

a diode disposed within said block, said diode having first and second contacts;

a resistor disposed within said block, said resistor having a pair of ohmic contacts at opposite ends thereof;

conductive means connecting said fourth layer, said control contact and said first diode contact;

conductive means connecting said first current carrying contact, said second diode contact and one of said resistor contacts so that said diode is connected in the blocking direction for current flow through said resistor, diode, and fourth layer;

conductive means connecting the other of said resistor contacts to said isolation region; and conductive means connecting said second current carrying contact to said block.

21. A semiconductor apparatus comprising:

a plurality of stages in accordance with claim 12;

means electrically interconnecting said plurality of stages;

first and second energizing terminals for connection to a source of energy;

means electrically connecting all of said block contacts and said seventh region contacts between said first and second terminals; and means electrically connecting all of said block contacts and said eighth region contacts between said first and second terminals.

22. A semiconductor apparatus comprising:

a plurality of semiconductor integrated circuit stages, each of said stages including at least a portion of a unitary block of semiconductive material with first and second four layer semiconductor devices, first semiconductor current controlling means, and further semiconductor current controlling means for connecting in controlling relation to the first device of another stage disposed therein, means connecting said first device in controlling relation to said first semiconductor means, further means connecting said first semiconductor means in controlling relation to said second device, and additional means connecting said second device in controlling relation to said further semiconductor means;

means electrically interconnecting said plurality of stages;

first and second energizing terminals for connection to a source of energy;

means electrically connecting all of said first devices between said first and second terminals; and means electrically connecting all of said second devices between said first and second terminals.

References Cited by the Examiner

UNITED STATES PATENTS

| | | | |
|---|---|---|---|
| 3,015,735 | 1/1962 | Wright et al. | 307—88.5 |
| 3,201,603 | 8/1965 | Gerlach | 307—88.5 |
| 3,230,388 | 1/1966 | Hounsfield | 307—88.5 |
| 3,230,398 | 1/1966 | Evans et al. | 307—88.5 |
| 3,235,748 | 2/1966 | Mahoney et al. | 307—88.5 |
| 3,260,858 | 7/1966 | Kueber | 307—88.5 |

ARTHUR GAUSS, *Primary Examiner.*

S. D. MILLER, *Assistant Examiner.*